(12) United States Patent
Choi

(10) Patent No.: US 12,652,767 B2
(45) Date of Patent: Jun. 9, 2026

(54) DISPLAY DEVICE INCLUDING ROLLER AND PRINTED CIRCUIT BOARD IN GROOVE OF ROLLER

(71) Applicant: Samsung Display Co., LTD., Yongin-si (KR)

(72) Inventor: Ji Woong Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 99 days.

(21) Appl. No.: 18/644,342

(22) Filed: Apr. 24, 2024

(65) Prior Publication Data

US 2024/0431046 A1    Dec. 26, 2024

(30) Foreign Application Priority Data

Jun. 21, 2023    (KR) ........................ 10-2023-0079907

(51) Int. Cl.
| | |
|---|---|
| *H05K 5/02* | (2006.01) |
| *H05K 5/00* | (2025.01) |
| *H05K 5/03* | (2006.01) |

(52) U.S. Cl.
CPC ......... H05K 5/0217 (2013.01); H05K 5/0026 (2013.01); H05K 5/03 (2013.01)

(58) Field of Classification Search
CPC ...... H05K 5/0217; H05K 5/0026; H05K 5/03; G06F 1/1637; G06F 1/1652; G09F 9/301; H10K 77/111; H10K 59/38
See application file for complete search history.

(56) References Cited

U.S. PATENT DOCUMENTS

| | | | |
|---|---|---|---|
| 2018/0031961 A1* | 2/2018 | Kasahara ............... | G03B 21/58 |
| 2021/0029839 A1* | 1/2021 | Kwon ....................... | H05K 5/03 |
| 2021/0083024 A1* | 3/2021 | Song ....................... | G09F 9/301 |
| 2021/0142698 A1* | 5/2021 | Oh ......................... | H10K 59/871 |
| 2021/0343194 A1* | 11/2021 | Suga ....................... | G09F 9/301 |
| 2022/0130289 A1* | 4/2022 | Kang ....................... | G09F 9/301 |
| 2023/0120521 A1* | 4/2023 | Yun ....................... | G06F 1/1652 |
| | | | 361/679.01 |

FOREIGN PATENT DOCUMENTS

| | | |
|---|---|---|
| KR | 10-2019-0036978 | 4/2019 |
| KR | 10-2434865 | 8/2022 |

OTHER PUBLICATIONS

Extended European Search Report for European Application No. 24182543.9, dated Oct. 22, 2024.

* cited by examiner

*Primary Examiner* — Allen L Parker
*Assistant Examiner* — Keon Kim
(74) *Attorney, Agent, or Firm* — CANTOR COLBURN LLP

(57) ABSTRACT

A display device includes a display panel, a roller including a groove recessed from an outer circumferential surface of the roller, and winding or unwinding the display panel, a printed circuit board disposed in the groove and electrically connected to the display panel, and a plurality of flexible films disposed between the display panel and the plurality of printed circuit boards.

17 Claims, 8 Drawing Sheets

DISPLAY DEVICE INCLUDING ROLLER AND PRINTED CIRCUIT BOARD IN GROOVE OF ROLLER

CROSS-REFERENCE TO RELATED APPLICATION(S)

This application claims priority to and benefits of Korean Patent Application No. 10-2023-0079907 under 35 USC § 119, filed on Jun. 21, 2023, in the Korean Intellectual Property Office (KIPO), the entire contents of which are incorporated herein by reference.

BACKGROUND

1. Technical Field

Embodiments relate to a display device. More specifically, embodiments relate to a rollable display device that displays an image.

2. Description of the Related Art

Recently, flexible display devices that are transformed into various forms have been developed. Unlike flat-panel displays, the flexible display devices may be folded, bent, or rolled like paper. The flexible display devices may readily carry, and may improve user convenience.

A flexible display panel used in the flexible display devices may have various shapes. For example, the flexible display panel may be connected to a roller, and may be wound around the roller or unwound from the roller.

SUMMARY

Embodiments provide a display device capable of improving reliability.

However, embodiments of the disclosure are not limited to those set forth herein. The above and other embodiments will become more apparent to one of ordinary skill in the art to which the disclosure pertains by referencing the detailed description of the disclosure given below.

A display device according to an embodiment may include a display panel, a roller including a groove recessed from an outer circumferential surface of the roller, the roller that winds or unwinds the display panel, and a printed circuit board disposed in the groove and electrically connected to the display panel.

In an embodiment, the display device may further include a cover member disposed in the groove and covering at least a portion of the printed circuit board. The printed circuit board may be fixed to the roller by the cover member.

In an embodiment, the display device may further include a screw fastened to the cover member. The cover member may be fixed to the roller by the screw.

In an embodiment, the display device may further include a flexible film on which a data driver is mounted. The display panel and the printed circuit board may be electrically connected by the flexible film.

In an embodiment, the screw may be spaced apart from the flexible film in a plan view.

In an embodiment, the cover member may overlap at least a portion of the flexible film in a plan view.

In an embodiment, the roller may include a protrusion protruding from a side surface of the groove toward a center portion of the groove and covering at least a portion of the printed circuit board.

In an embodiment, the printed circuit board may include a first area and a second area spaced apart from the first area. The cover member may cover the printed circuit board in the first area, and the protrusion of the roller may cover the printed circuit board in the second area.

In an embodiment, the groove may be formed along a curvature of the outer circumferential surface of the roller.

In an embodiment, a depth of the groove may be smaller than a thickness of the roller.

In an embodiment, the printed circuit board may be disposed outside an inner circumferential surface of the roller.

In an embodiment, the display device may further include a housing that accommodates the display panel and the roller and includes an opening through which the display panel enters or exits.

In an embodiment, the display panel may include a substrate, a color conversion layer disposed on the substrate, and a color filter layer disposed on the color conversion layer.

In an embodiment, the substrate may include glass.

A display device according to an embodiment includes a display panel, a roller including a groove recessed from an outer circumferential surface of the roller along a curvature of the outer circumferential surface, the roller that winds or unwinds the display panel, a plurality of printed circuit boards disposed in the groove, spaced apart from the display panel in a first direction, and arranged in a second direction intersecting the first direction, and a plurality of flexible films disposed between the display panel and the plurality of printed circuit boards, spaced apart from each other, arranged in the second direction, and electrically connecting the display panel and each of the plurality of printed circuit boards.

In an embodiment, the display device may further include a cover member disposed in the groove and covering at least a portion of each of the plurality of printed circuit boards, and at least one screw fastened to the cover member. The plurality of printed circuit boards may be fixed to the roller by the cover member, and the cover member may be fixed to the roller by the at least one screw.

In an embodiment, the at least one screw may be fastened to the cover member between adjacent flexible films among the plurality of flexible films.

In an embodiment, a depth of the groove may be smaller than a thickness of the roller.

In an embodiment, the display panel may include a glass substrate.

In an embodiment, the display panel may further include a color conversion layer disposed on the glass substrate, and a color filter layer disposed on the color conversion layer.

In a display device according to embodiments, a printed circuit board may be disposed in a groove recessed from an outer circumferential surface of a roller and connected to a display panel. For example, the printed circuit board may be fixed to the roller by a cover member and a screw. As the printed circuit board is not disposed inside the roller but is disposed adjacent to the outer circumferential surface of the roller, an end portion of the display panel that starts to be wound around the roller may have a gently curved shape. Accordingly, although the display panel includes a material with relatively high rigidity, cracks may not occur in the display panel with winding or unwinding the display panel on the roller. For example, in case that the display panel includes a glass substrate, although the display panel is wound or unwound on the roller, cracks may not occur in the display panel.

DETAILED DESCRIPTION OF THE EMBODIMENTS

Figure 1:
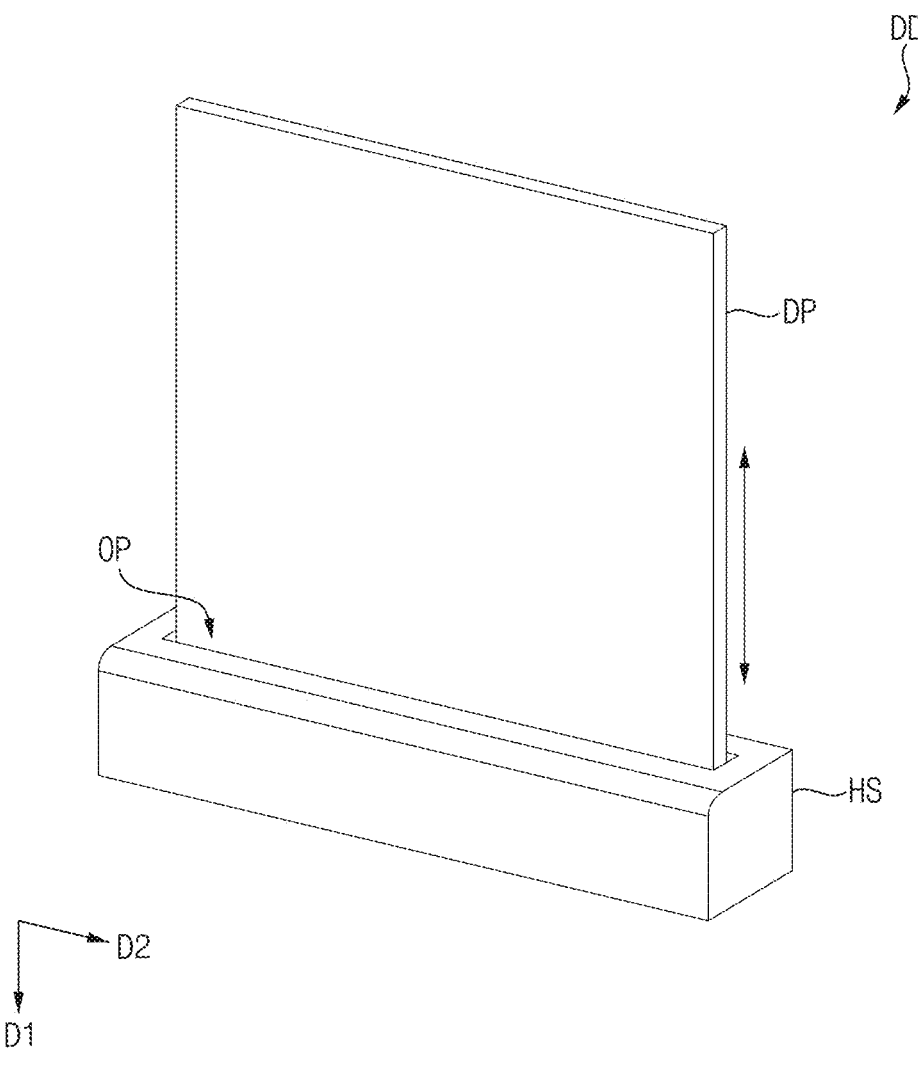
FIGS. 1 and 2 are schematic perspective views illustrating a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element (or a layer) is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the X, Y, and Z-axes, and may be interpreted in a broader sense. For example, the D1-axis, the D2-axis, and the D3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein are interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Hereinafter, embodiments will be described in more detail with reference to the accompanying drawings. The same reference numerals are used for the same components in the drawings, and redundant descriptions of the same components will be omitted.

Figure 2:
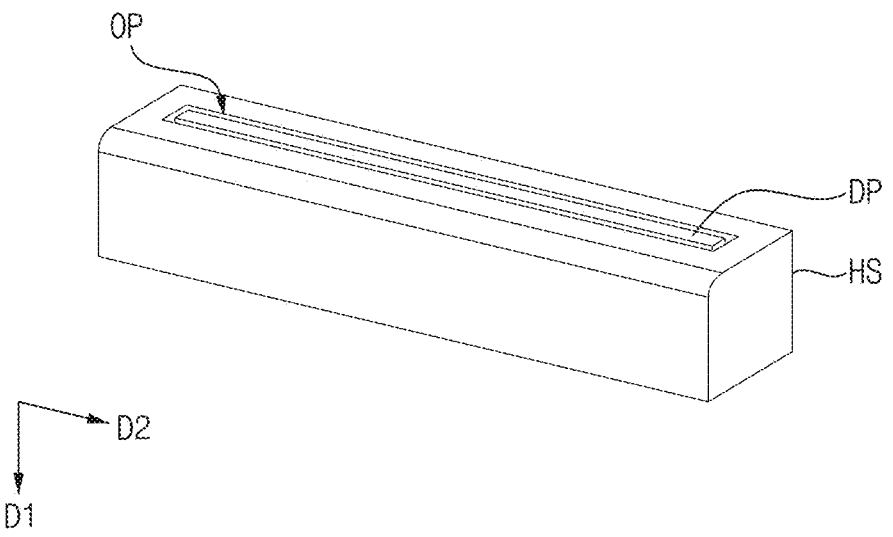
Figure 3:
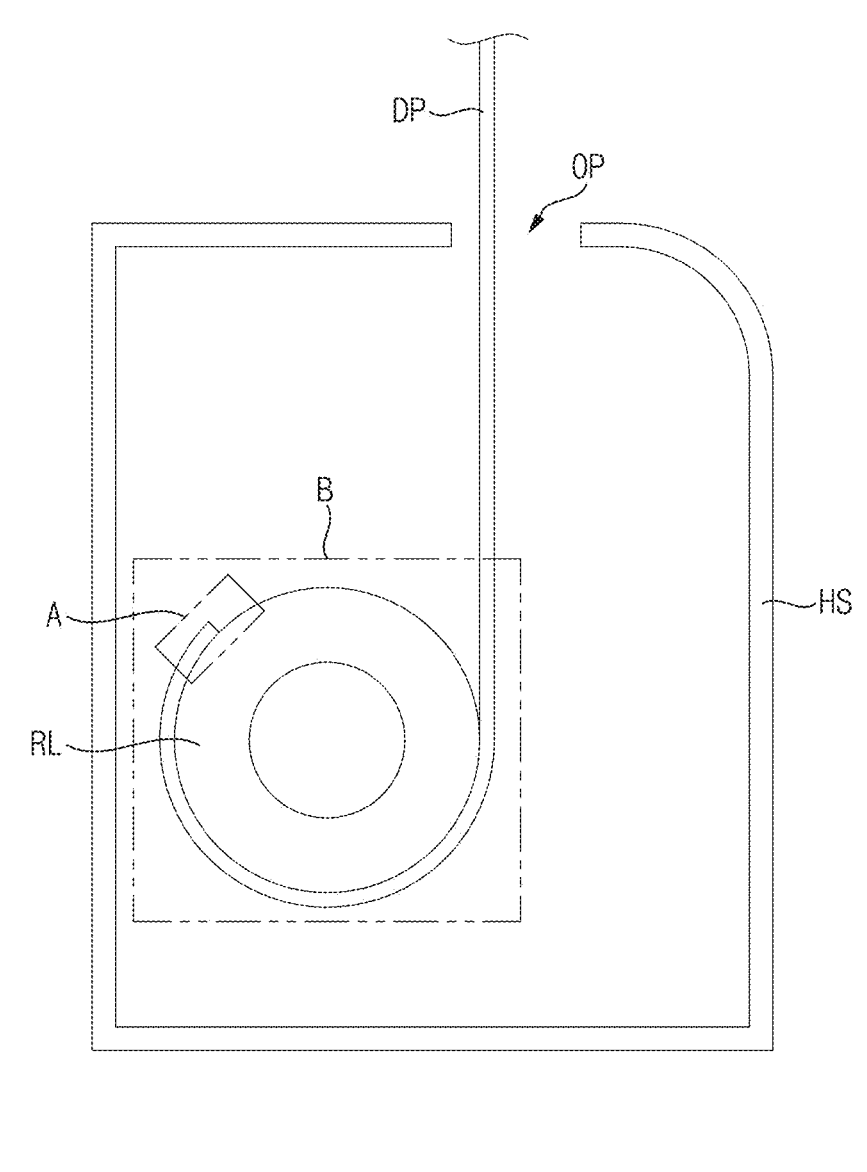
FIG. 3 is a schematic cross-sectional view illustrating the display device of FIG. 1.

FIGS. 1 and 2 are schematic perspective views illustrating a display device according to an embodiment. FIG. 3 is a schematic cross-sectional view illustrating the display device of FIG. 1.

Referring to FIGS. 1, 2, and 3, a display device DD may include a housing HS, a display panel DP, and a roller RL.

The housing HS may define an internal space that accommodates the display panel DP and the roller RL. For example, the housing HS may define an opening OP through which the display panel DP enters or exits the housing HS. For example, the opening OP may have various shapes according to a shape of the display panel DP. The display panel DP may enter or exit the housing HS in a first direction D1 or in a direction opposite to the first direction D1 through the opening OP.

In an embodiment, the display panel DP may be a flexible display panel. For example, the display panel DP may be a rollable display panel. Accordingly, the display panel DP may display an image although a part of the display panel DP is rolled. For example, an area where an image is displayed to a user may be provided regardless of an area where the display panel DP is rolled.

The roller RL may wind or unwind the display panel DP. In an embodiment, the roller RL may have a cylindrical shape extending in a second direction D2 intersecting the first direction D1. For example, the second direction D2 may be perpendicular to the first direction D1. However, embodiments are not limited thereto, and the roller RL may have various shapes that wind or unwind the display panel DP.

The roller RL may be connected to an end portion of the display panel DP. The end portion of the display panel DP may be fixed to the roller RL. The display panel DP may be wound around the roller RL from the end portion of the display panel DP.

In an embodiment, the roller RL may rotate around a rotation axis parallel to the second direction D2. For example, the roller RL may rotate clockwise or counterclockwise around the rotation axis parallel to the second direction D2 to wind or unwind the display panel DP around the roller RL.

In case that power is applied to the display panel DP or a display function is operated, the display panel DP wound around the roller RL inside the housing HS may be exposed outside of the housing HS through the opening OP with sliding in the direction opposite to the first direction D1 by rotation of the roller RL. For example, in case that the power is not applied to the display panel DP or the display function is not operated, the display panel DP exposed to the outside of the housing HS may be wound around the roller RL inside the housing HS through the opening OP with sliding in the first direction D1 by the rotation of the roller RL.

Figure 4:
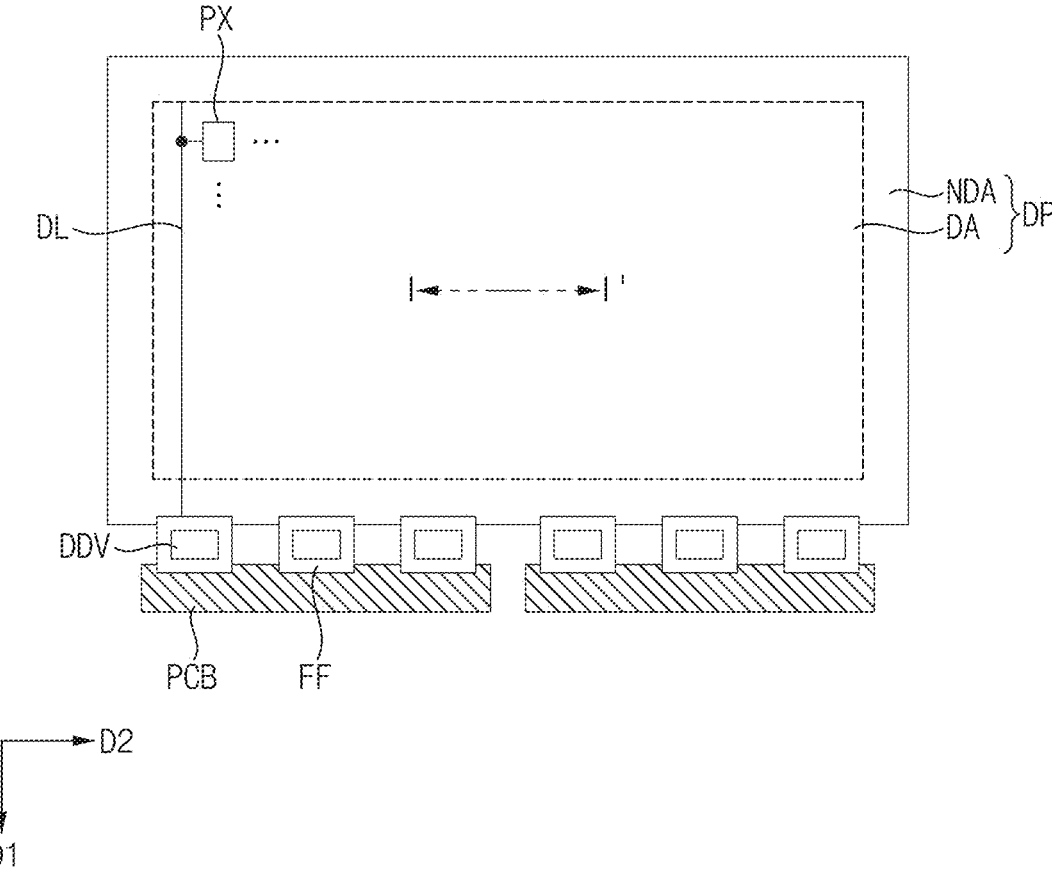
FIG. 4 is a schematic plan view illustrating a portion of the display device of FIG. 1.

FIG. 4 is a schematic plan view illustrating a portion of the display device of FIG. 1. For example, FIG. 4 may be a schematic plan view in a state in which the display panel DP is fully unrolled.

Referring to FIGS. 1 and 4, the display device DD may include the display panel DP, printed circuit boards PCB, and flexible films FF.

The display panel DP may include a display area DA and a non-display area NDA.

The display area DA may be an area that displays an image. In the display area DA, pixels PX may be repeatedly arranged along the first direction D1 and the second direction D2 in a plan view. Each of the pixels PX may be defined as a minimum light emitting unit that displays light.

Signal lines such as a data line DL may be disposed in the display area DA. The signal lines may be connected (e.g., electrically connected) to each of the pixels PX. Each of the pixels PX may receive a signal or a voltage from the signal lines.

The non-display area NDA may be an area that does not display an image. The non-display area NDA may be disposed around the display area DA. For example, the non-display area NDA may surround (e.g., entirely surround) the display area DA. Drivers that provide the signal or the voltage to the pixels PX may be disposed in the non-display area NDA.

Each of the flexible films FF may be disposed between the display panel DP and the printed circuit boards PCB. The flexible films FF may be arranged in the second direction D2, and may be spaced apart from each other. Each of the flexible films FF may be connected (e.g., electrically connected) to the display panel DP and the printed circuit board PCB.

Data drivers DDV may be mounted on the flexible films FF, respectively. For example, the data drivers DDV may be implemented as integrated circuits (ICs) and mounted on the flexible films FF in a chip-on-film (COF) method, respectively. The data drivers DDV may be connected (e.g., electrically connected) to the pixels PX through the data line DL, respectively. Accordingly, the data drivers DDV may provide a data voltage to each of the pixels PX.

Each of the printed circuit boards PCB may be spaced apart from the display panel DP in the first direction D1. The printed circuit boards PCB may be arranged in the second direction D2, and may be spaced apart from each other. For example, each of the printed circuit boards PCB may be connected (e.g., electrically connected) to the flexible films FF. For example, the printed circuit boards PCB may be connected (e.g., electrically connected) to the display panel DP through the flexible films FF.

A timing controller may be implemented as an integrated circuit and mounted on the printed circuit boards PCB in a chip-on-film method. The timing controller may be connected (e.g., electrically connected) to the data drivers DDV and the drivers disposed in the non-display area NDA of the display panel DP through the printed circuit boards PCB and the flexible films FF. Accordingly, the timing controller may control the data drivers DDV and the drivers.

Figure 5:
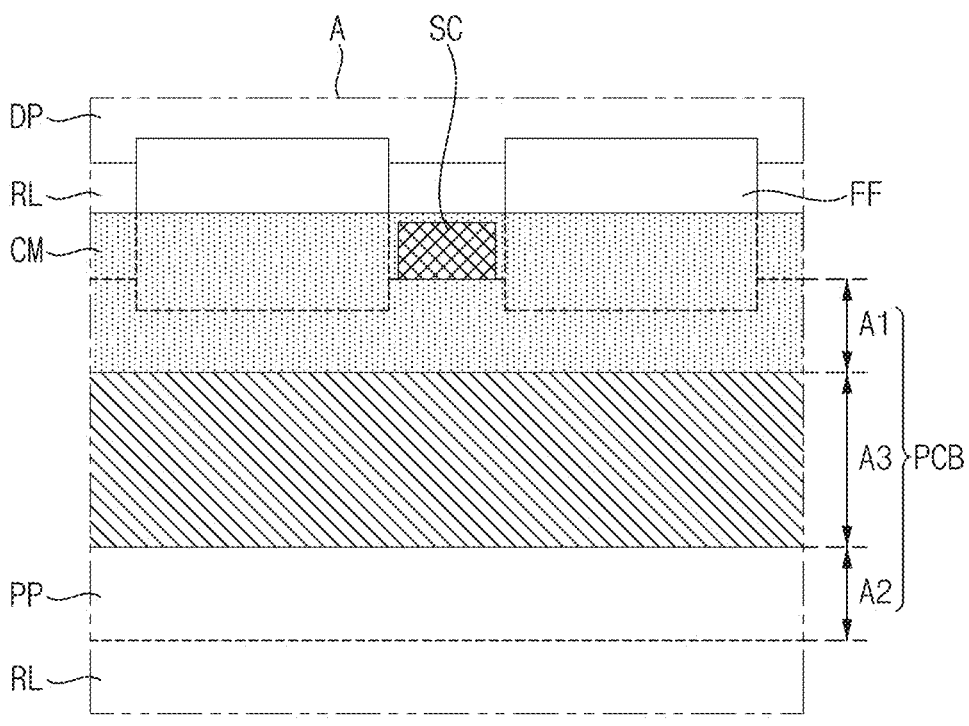
FIG. 5 is an enlarged schematic plan view of area A of FIG. 3.
Figure 6:
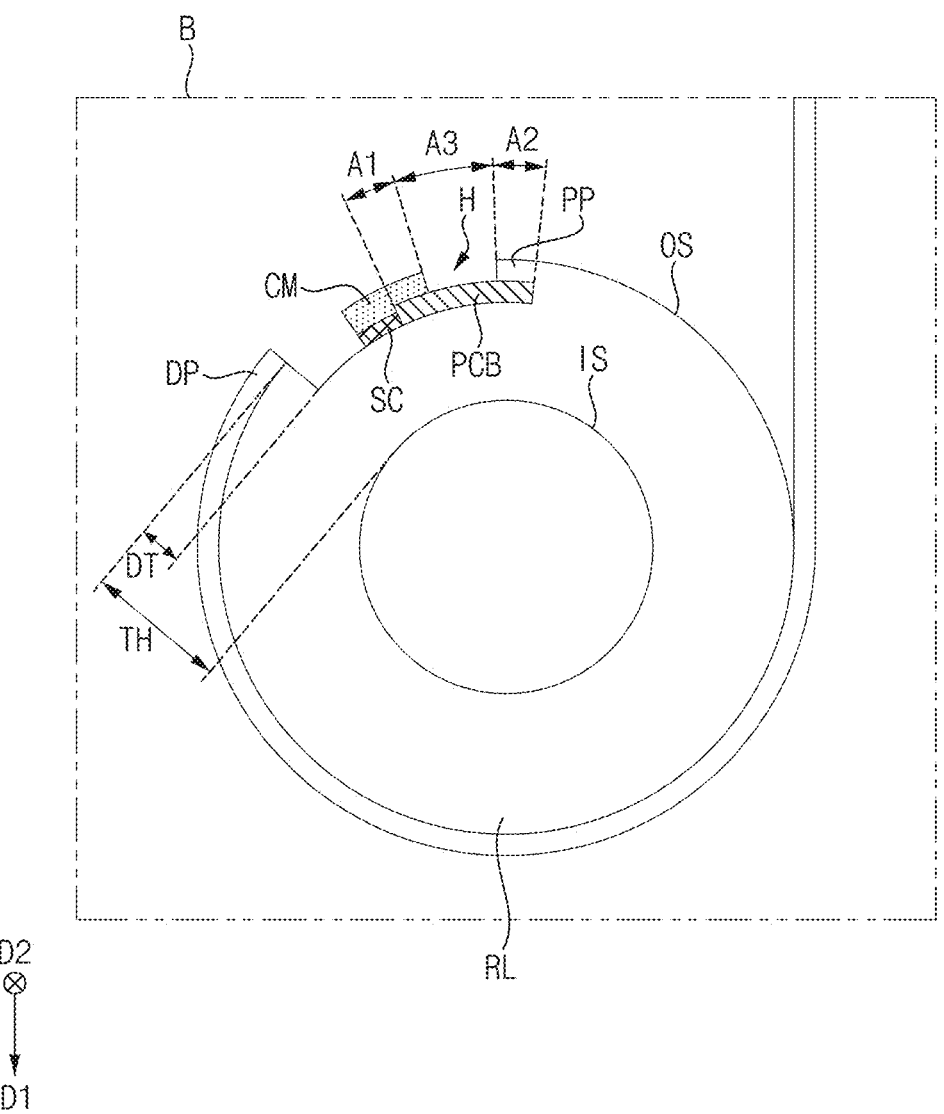
FIG. 6 is an example of an enlarged schematic cross-sectional view of area B of FIG. 3.
Figure 7:
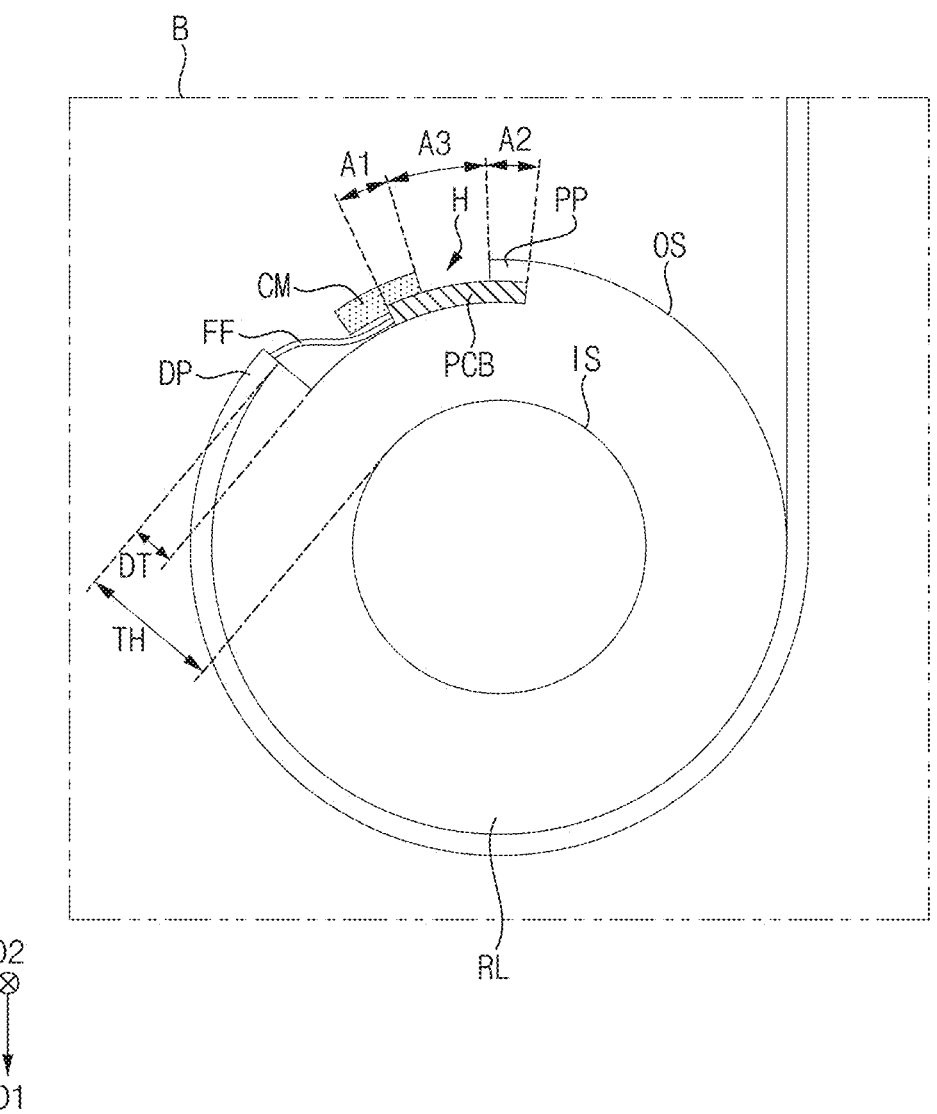
FIG. 7 is another example of an enlarged schematic cross-sectional view of area B of FIG. 3.

FIG. 5 is an enlarged schematic plan view of area A of FIG. 3. FIG. 6 is an example of an enlarged schematic cross-sectional view of area B of FIG. 3. FIG. 7 is another example of an enlarged schematic cross-sectional view of area B of FIG. 3.

FIG. 6 may be an enlarged schematic cross-sectional view of an area where the flexible film FF is not disposed, and FIG. 7 may be an enlarged schematic cross-sectional view of an area where the flexible film FF is disposed.

Referring to FIGS. 3, 4, 5, 6, and 7, the display device DD may include the display panel DP, the roller RL, the printed circuit board PCB, the flexible films FF, a cover member CM, and at least one screw SC.

The roller RL may rotate around the rotation axis parallel to the second direction D2 to wind or unwind the display panel DP. In an embodiment, the roller RL may have a hollow cylindrical shape. The roller RL may include an outer circumferential surface OS and an inner circumferential surface IS facing the outer circumferential surface OS, and inside of the inner circumferential surface IS of the roller RL may be empty. The display panel DP may be wound or unwound on the roller RL along the outer circumferential surface OS.

In an embodiment, the roller RL may define a groove H recessed from the outer circumferential surface OS toward the inner circumferential surface IS. For example, a depth DT of the groove H may be smaller than a thickness TH of the roller RL. For example, the depth DT of the groove H may be a shortest distance from a bottom surface of the groove H to the outer circumferential surface OS of the roller RL, and the thickness TH of the roller RL may be a shortest distance from the inner circumferential surface IS of the roller RL to the outer circumferential surface OS of the roller RL. For example, the groove H may be defined along a curvature of the outer circumferential surface OS. For example, the depth DT of the groove H may be substantially constant along the curvature of the outer circumferential surface OS.

The end portion of the display panel DP that starts to be wound around the roller RL may be fixed to a portion of the outer circumferential surface OS of the roller RL. For example, the end portion of the display panel DP may extend and be fixed to an edge portion of a first side surface of the groove H.

The roller RL may include a protrusion PP protruding from a second side surface facing the first side surface of the groove H toward a center portion of the groove H. The protrusion PP may form a portion of the outer circumferential surface OS. For example, the protrusion PP may be spaced apart from the bottom surface of the groove H to define (or form) a space between the protrusion PP and the bottom surface of the groove H.

The printed circuit board PCB may be disposed in the groove H, and may be disposed along the curvature of the groove H. The printed circuit board PCB may be positioned outside the inner circumferential surface IS of the roller RL. For example, the printed circuit board PCB may be positioned between the outer circumferential surface OS and the inner circumferential surface IS in a cross-sectional view. The printed circuit board PCB may include a first area A1, a second area A2 spaced apart from the first area A1, and a third area A3 positioned between the first area A1 and the second area A2.

At least a portion of the printed circuit board PCB may be disposed in the space defined by the protrusion PP. The protrusion PP may cover at least a portion of the printed circuit board PCB. For example, the second area A2 may be an area of the printed circuit board PCB disposed in the space and covered by the protrusion PP.

Each of the flexible films FF may connect the display panel DP and the printed circuit board PCB. For example, each of the flexible films FF may be connected (e.g., electrically connected) to the printed circuit board PCB disposed in the groove H and the end portion of the display panel DP disposed on the outer circumferential surface OS of the roller RL.

The cover member CM may be disposed in the groove H. In an embodiment, the cover member CM may cover at least a portion of the printed circuit board PCB. The cover member CM may be spaced apart from the protrusion PP. For example, the first area A1 may be an area of the printed circuit board PCB covered by the cover member CM. For example, the third area A3 may be an area of the printed circuit board PCB that is not covered by the cover member CM or the roller RL.

Accordingly, the printed circuit board PCB may be fixed to the roller RL. For example, the printed circuit board PCB may be fixed to the groove H by the cover member CM and the protrusion PP of the roller RL. The printed circuit board PCB may be disposed adjacent to the outer circumferential surface OS of the roller RL.

For example, the cover member CM may overlap at least a portion of each of the flexible films FF in a plan view. The cover member CM may extend along the curvature of the outer circumferential surface OS in a direction from the first area A1 toward the first side surface of the groove H.

The screw SC may be fastened to the cover member CM. In an embodiment, the screw SC may fix the cover member CM to the roller RL. Accordingly, the printed circuit board PCB may be fixed to the roller RL.

The screw SC may be spaced apart from the flexible films FF in a plan view. For example, the screw SC may not overlap the flexible films FF in a plan view. The screw SC may be fastened to the cover member CM between adjacent flexible films among the flexible films FF spaced apart from each other. For example, the cover member CM may be fixed to the roller RL by the screw SC in an area where the flexible films FF are not disposed. For example, the cover member CM may be spaced apart from the roller RL in an area where the flexible films FF are disposed.

The screw SC may be continuously or discontinuously disposed between the adjacent flexible films FF. The number of the screws SC may be variously changed according to the size of the display panel DP, the number of the flexible films FF, or the like.

In the display device DD according to an embodiment, the printed circuit board PCB may be disposed in the groove H of the roller RL and connected (e.g., electrically connected) to the display panel DP. For example, the printed circuit board PCB may be fixed to the roller RL by the cover member CM and the screw SC. As the printed circuit board PCB is disposed adjacent to the outer circumferential surface OS of the roller RL, the end portion of the display panel DP that starts to be wound around the roller RL may have a gently curved shape. Accordingly, although the display panel DP includes a material with relatively high rigidity, cracks may not occur in the display panel DP with winding or unwinding the display panel DP on the roller RL. For example, in case that the display panel DP includes a glass substrate, although the display panel DP is wound or unwound on the roller RL, cracks may not occur in the display panel DP.

Figure 8:
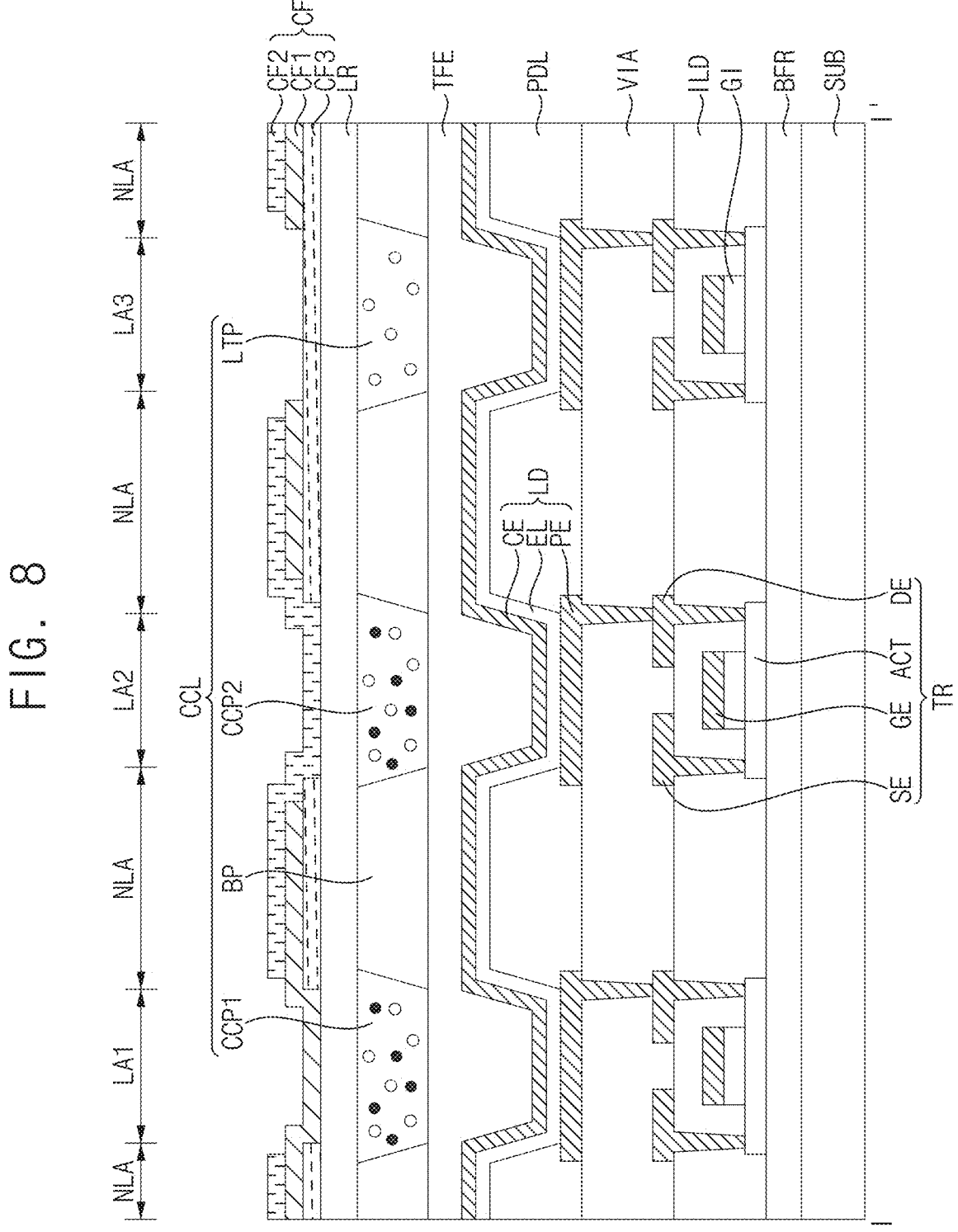
FIG. 8 is a schematic cross-sectional view taken along line I-I' of FIG. 4.

FIG. 8 is a schematic cross-sectional view taken along line I-I' of FIG. 4. For example, FIG. 8 may be a schematic cross-sectional view illustrating a portion of the display area DA of the display panel DP.

Referring to FIGS. 1, 4, and 8, the display panel DP may include a first light emitting area LA1, a second light emitting area LA2, a third light emitting area LA3, and a non-light emitting area NLA.

Each of the first, second, and third light emitting areas LA1, LA2, and LA3 may be an area where light emitted from a light emitting element LD is emitted outside of the display device DD. The first light emitting area LA1 may emit first light, the second light emitting area LA2 may emit second light, and the third light emitting area LA3 may emit third light. For example, the first light may be light in a red wavelength band, the second light may be light in a green wavelength band, and the third light may be light in a blue wavelength band, but embodiments are not limited thereto.

The non-light emitting area NLA may be an area that does not emit light. The non-light emitting area NLA may be positioned between the first, second, and third light emitting areas LA1, LA2, and LA3. For example, in a plan view, the non-light emitting area NLA may surround the first, second, and third light emitting areas LA1, LA2, and LA3.

Although FIG. 8 illustrates that the display panel DP includes three light emitting areas LA1, LA2, and LA3, embodiments are not limited thereto. In another example, the display panel DP may include four or more light emitting areas.

The display panel DP may include a substrate SUB, a buffer layer BFR, a transistor TR, a gate insulating layer GI, an interlayer insulating layer ILD, a via insulating layer VIA, the light emitting element LD, a pixel defining layer PDL, an encapsulation layer TFE, a color conversion layer CCL, a low refractive index layer LR, and a color filter layer CFL.

For example, the transistor TR may include an active pattern ACT, a gate electrode GE, a source electrode SE, and a drain electrode DE. The light emitting element LD may include a pixel electrode PE, a light emitting layer EL, and a common electrode CE.

The substrate SUB may include a transparent material or an opaque material. For example, the substrate SUB may include glass, quartz, plastic, or the like. These may be used alone or in combination with each other. In an embodiment, the substrate SUB may be a glass substrate.

The buffer layer BFR may be disposed on the substrate SUB. The buffer layer BFR may prevent metal atoms or impurities from diffusing from the substrate SUB to the transistor TR. For example, the buffer layer BFR may improve a flatness of a surface of the substrate SUB in case that the surface of the substrate SUB is not uniform. The buffer layer BFR may include an inorganic material such as silicon oxide ($SiO_x$), silicon nitride ($SiN_x$), silicon carbide ($SiC_x$), silicon oxynitride ($SiO_xN_y$), silicon oxycarbide ($SiO_xC_y$), or the like. These may be used alone or in combination with each other.

The active pattern ACT may be disposed on the buffer layer BFR. The active pattern ACT may include a source area, a drain area, and a channel area positioned between the source area and the drain area. The active pattern ACT may include a silicon semiconductor material or an oxide semiconductor material. Examples of the silicon semiconductor material may include amorphous silicon, polycrystalline silicon, or the like. Examples of the oxide semiconductor material may include indium gallium zinc oxide (IGZO), indium tin zinc oxide (ITZO), or the like. These may be used alone or in combination with each other.

The gate insulating layer GI may be disposed on the active pattern ACT. The gate insulating layer GI may overlap the channel area of the active pattern ACT. The gate insulating layer GI may include an inorganic material such as silicon oxide ($SiO_x$), silicon nitride ($SiN_x$), silicon carbide ($SiC_x$), silicon oxynitride ($SiO_xN_y$), silicon oxycarbide ($SiO_xC_y$), or the like. These may be used alone or in combination with each other.

The gate electrode GE may be disposed on the gate insulating layer GI. The gate electrode GE may overlap the channel area of the active pattern ACT. The gate electrode GE may include metal, alloy, metal nitride, conductive metal oxide, metal nitride, or the like. Examples of the metal may include silver (Ag), molybdenum (Mo), aluminum (Al), tungsten (W), copper (Cu), nickel (Ni), chromium (Cr), titanium (Ti), tantalum (Ta), platinum (Pt), scandium (Sc), or the like. Examples of the conductive metal oxide may include indium tin oxide, indium zinc oxide, or the like. Examples of the metal nitride may include aluminum nitride ($AlN_x$), tungsten nitride ($WN_x$), chromium nitride ($CrN_x$), or the like. These may be used alone or in combination with each other.

The interlayer insulating layer ILD may be disposed on the gate electrode GE. The interlayer insulating layer ILD may sufficiently cover the gate electrode GE, and may have a substantially flat upper surface without creating (or forming) a step portion around the gate electrode GE. In another example, the interlayer insulating layer ILD may cover the gate electrode GE, and may be disposed along a profile of the gate electrode GE with a uniform thickness. The interlayer insulating layer ILD may include an inorganic material such as silicon oxide ($SiO_x$), silicon nitride ($SiN_x$), silicon carbide ($SiC_x$), silicon oxynitride ($SiO_xN_y$), silicon oxycarbide ($SiO_xC_y$), or the like. These may be used alone or in combination with each other.

The source electrode SE and the drain electrode DE may be disposed on the interlayer insulating layer ILD. The source electrode SE may be connected (e.g., electrically connected) to the source area of the active pattern ACT through a first contact hole penetrating the gate insulating layer GI and the interlayer insulating layer ILD. For example, the drain electrode DE may be connected (e.g., electrically connected) to the drain area of the active pattern ACT through a second contact hole penetrating the gate insulation layer GI and the interlayer insulation layer ILD. For example, each of the source electrode SE and the drain electrode DE may include metal, alloy, metal nitride, conductive metal oxide, transparent conductive material, or the like. These may be used alone or in combination with each other.

Accordingly, the transistor TR including the active pattern ACT, the gate electrode GE, the source electrode SE, and the drain electrode DE may be disposed on the substrate SUB.

The via insulating layer VIA may be disposed on the interlayer insulating layer ILD. The via insulating layer VIA may sufficiently cover the source electrode SE and the drain electrode DE. The via insulating layer VIA may include an organic material such as phenol resin, acrylic resin, polyimide resin, polyamide resin, siloxane resin, epoxy resin, or the like. These may be used alone or in combination with each other.

The pixel electrode PE may be disposed on the via insulating layer VIA. The pixel electrode PE may be connected (e.g., electrically connected) to the drain electrode DE through a contact hole penetrating the via insulating layer VIA. The pixel electrode PE may include metal, alloy, metal nitride, conductive metal oxide, transparent conductive material, or the like. These may be used alone or in combination with each other. For example, the pixel electrode PE may operate (or function) as an anode.

The pixel defining layer PDL may be disposed on the via insulating layer VIA. The pixel defining layer PDL may cover at least a portion of the pixel electrode PE. For example, the pixel defining layer PDL may cover an edge portion of the pixel electrode PE. For example, an opening exposing at least a portion of an upper surface of the pixel electrode PE may be defined in the pixel defining layer PDL. The pixel defining layer PDL may include an inorganic material or an organic material. For example, the pixel defining layer PDL may include an organic material such as epoxy resin, siloxane resin, or the like. For another example, the pixel defining layer PDL may include an inorganic material or an organic material including a black-colored light blocking material.

The light emitting layer EL may be disposed on the pixel electrode PE and the pixel defining layer PDL. The light emitting layer EL may be disposed (e.g., entirely disposed) in the display area DA. The light emitting layer EL may include an organic material that emits light of a preset color. For example, the light emitting layer EL may emit light in a blue wavelength band, but embodiments are not limited thereto.

The common electrode CE may be disposed on the light emitting layer EL. The common electrode CE may be a plate electrode. The common electrode CE may include metal, alloy, metal nitride, conductive metal oxide, transparent conductive material, or the like. These may be used alone or in combination with each other. For example, the common electrode CE may operate (or function) as a cathode.

Accordingly, the light emitting element LD including the pixel electrode PE, the light emitting layer EL, and the common electrode CE may be disposed on the substrate SUB. The light emitting element LD may be electrically connected (e.g., electrically connected) to the transistor TR.

The encapsulation layer TFE may be disposed on the common electrode CE. The encapsulation layer TFE may protect the light emitting element LD from external oxygen and moisture. The encapsulation layer TFE may include at least one inorganic layer and at least one organic layer.

The color conversion layer CCL may be disposed on the encapsulation layer TFE. The color conversion layer CCL may include a bank pattern BP, a first color conversion pattern CCP1, a second color conversion pattern CCP2, and a transmission pattern LTP.

The bank pattern BP may overlap the non-light emitting area NLA. The bank pattern BP may define an opening overlapping each of the first, second, and third light emitting areas LA1, LA2, and LA3. The bank pattern BP may include a light blocking material, and may block light emitted from a lower portion.

Each of the first and second color conversion patterns CCP1 and CCP2 and the transmission pattern LTP may be disposed in the opening defined by the bank pattern BP. The first color conversion pattern CCP1 may be disposed in the opening overlapping the first light emitting area LA1, the second color conversion pattern CCP2 may be disposed in the opening overlapping the second light emitting area LA2, and the transmission pattern LTP may be disposed in the opening overlapping the third light emitting area LA3.

Each of the first and second color conversion patterns CCP1 and CCP2 may convert light emitted from the light emitting layer EL into light having a specific wavelength.

The first color conversion pattern CCP1 may include first quantum dots that are excited by the light emitted from the light emitting layer EL and emit the first light. For example, the first color conversion pattern CCP1 may further include first scattering particles and a first photosensitive polymer in which the first scattering particles are dispersed. In an embodiment, the first color conversion pattern CCP1 may convert the light emitted from the light emitting layer EL into the first light. For example, as the light emitted from the light emitting layer EL passes through the first color conversion pattern CCP1, light in a red wavelength band may be emitted from the first light emitting area LA1, but embodiments are not limited thereto.

The second color conversion pattern CCP2 may include second quantum dots that are excited by the light emitted from the light emitting layer EL and emit the second light. For example, the second color conversion pattern CCP2 may further include second scattering particles and a second photosensitive polymer in which the second scattering particles are dispersed. In an embodiment, the second color conversion pattern CCP2 may convert the light emitted from the light emitting layer EL into the second light. For example, as the light emitted from the light emitting layer EL passes through the second color conversion pattern CCP2, light in a green wavelength band may be emitted from the second light emitting area LA2, but embodiments are not limited thereto.

The transmission pattern LTP may include third scattering particles and a third photosensitive polymer in which the third scattering particles are dispersed. In an embodiment, the transmission pattern LTP may transmit the light emitted from the light emitting layer EL. For example, as the light emitted from the light emitting layer EL passes through the transmission pattern LTP, light in a blue wavelength band may be emitted from the third light emitting area LA3, but embodiments are not limited thereto.

The first, second, and third scattering particles may scatter and emit the light emitted from the light emitting layer EL. The first, second, and third scattering particles may include a same material. Each of the first, second, and third photosensitive polymers may include an organic material having light transmittance such as silicone resin, epoxy resin, or the like.

The low refractive index layer LR may be disposed on the color conversion layer CCL. The low refractive index layer LR may have a predetermined refractive index. The low refractive index layer LR may improve a light efficiency of the display device DD.

Although FIG. 8 illustrates that the low refractive index layer LR is disposed on the color conversion layer CCL, embodiments are not limited thereto. In another example, the low refractive index layer LR may be disposed under the color conversion layer CCL. For example, the low refractive layer LR may include first and second low refractive layers, the first low refractive layer may be disposed on the color conversion layer CCL, and the second low refractive layer may be disposed under the color conversion layer CCL.

The color filter layer CFL may be disposed on the low refractive index layer LR. The color filter layer CFL may include a first color filter CF1, a second color filter CF2, and a third color filter CF3. Each of the first, second, and third color filters CF1, CF2, and CF3 may selectively transmit light having a specific wavelength.

The first color filter CF1 may overlap the first color conversion pattern CCP1, the second color filter CF2 may overlap the second color conversion pattern CCP2, and the third color filter CF3 may overlap the transmission pattern LTP.

The first color filter CF1 may transmit the first light, and may block light in a wavelength band different from the first light. The second color filter CF2 may transmit the second light, and may block light in a wavelength band different from the second light. The third color filter CF3 may transmit the third light, and may block light in a wavelength band different from the third light. For example, the first color filter CF1 may transmit light in a red wavelength band, the second color filter CF2 may transmit light in a green wavelength band, and the third color filter CF3 may transmit light in a blue wavelength band, but embodiments are not limited thereto.

For example, the cross-sectional structure of the display area DA illustrated in FIG. 8 is only an example, and may be variously changed according to embodiments.

The disclosure can be applied to various display devices. For example, embodiments are applicable to various display devices such as display devices for vehicles, ships and aircraft, portable communication devices, display devices for exhibition or information transmission, medical display devices, and the like.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:
a display panel;
a roller including a groove recessed from an outer circumferential surface of the roller, the roller that winds or unwinds the display panel;
a printed circuit board disposed in the groove and electrically connected to the display panel; and
a cover member disposed in the groove and covering at least a portion of the printed circuit board,
wherein the printed circuit board is fixed to the roller by the cover member,
wherein the roller includes a protrusion protruding from a side surface of the groove toward a center portion of the groove and covering at least a portion of the printed circuit board,
wherein the printed circuit board includes a first area and a second area spaced apart from the first area,
the cover member covers the printed circuit board in the first area, and
the protrusion of the roller covers the printed circuit board in the second area.

2. The display device of claim 1, further comprising:
a screw fastened to the cover member,
wherein the cover member is fixed to the roller by the screw.

3. The display device of claim 2, further comprising:
a flexible film on which a data driver is mounted,
wherein the display panel and the printed circuit board are electrically connected by the flexible film.

4. The display device of claim 3, wherein the screw is spaced apart from the flexible film in a plan view.

5. The display device of claim 3, wherein the cover member overlaps at least a portion of the flexible film in a plan view.

6. The display device of claim 1, wherein the groove is formed along a curvature of the outer circumferential surface of the roller.

7. The display device of claim 1, wherein a depth of the groove is smaller than a thickness of the roller.

8. The display device of claim 1, wherein the printed circuit board is disposed outside an inner circumferential surface of the roller.

9. The display device of claim 1, further comprising:
a housing that accommodates the display panel and the roller and includes an opening through which the display panel enters or exits.

10. The display device of claim 1, wherein the display panel includes:
a substrate;
a color conversion layer disposed on the substrate; and
a color filter layer disposed on the color conversion layer.

11. The display device of claim 10, wherein the substrate includes glass.

12. A display device comprising:
a display panel;
a roller including a groove recessed from an outer circumferential surface of the roller along a curvature of the outer circumferential surface, the roller that winds or unwinds the display panel;
a plurality of printed circuit boards disposed in the groove, spaced apart from the display panel in a first direction, and arranged in a second direction intersecting the first direction;
a plurality of flexible films disposed between the display panel and the plurality of printed circuit boards, spaced apart from each other, arranged in the second direction, and electrically connecting the display panel and each of the plurality of printed circuit boards; and
a cover member disposed in the groove and covering at least a portion of each of the plurality of the printed circuit boards,
wherein each of the plurality of printed circuit boards is fixed to the roller by the cover member,
wherein the roller includes a protrusion protruding from a side surface of the groove toward a center portion of the groove and covering at least a portion of each of the plurality of the printed circuit boards,
wherein each of the plurality of printed circuit boards includes a first area and a second area spaced apart from the first area,
the cover member covers each of the plurality of printed circuit boards in the first area, and
the protrusion of the roller covers each of the plurality of printed circuit boards in the second area.

13. The display device of claim 12, further comprising:
at least one screw fastened to the cover member, wherein the cover member is fixed to the roller by the at least one screw.

14. The display device of claim 13, wherein the at least one screw is fastened to the cover member between adjacent flexible films among the plurality of flexible films.

15. The display device of claim 12, wherein a depth of the groove is smaller than a thickness of the roller.

16. The display device of claim 12, wherein the display panel includes a glass substrate.

17. The display device of claim 16, wherein the display panel further includes:

a color conversion layer disposed on the glass substrate; and a color filter layer disposed on the color conversion layer.

\* \* \* \* \*